US012039249B2

(12) United States Patent
Huang et al.

(10) Patent No.: US 12,039,249 B2
(45) Date of Patent: *Jul. 16, 2024

(54) SYSTEM AND METHOD FOR DIAGNOSING DESIGN RULE CHECK VIOLATIONS

(71) Applicant: Taiwan Semiconductor Manufacturing Company, Ltd., Hsinchu (TW)

(72) Inventors: Yu-Chen Huang, Hsinchu (TW); Heng-Yi Lin, Hsinchu (TW); Yi-Lin Chuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/876,118

(22) Filed: Jul. 28, 2022

(65) Prior Publication Data

US 2022/0391574 A1 Dec. 8, 2022

Related U.S. Application Data

(63) Continuation of application No. 17/103,748, filed on Nov. 24, 2020, now Pat. No. 11,443,097.

(51) Int. Cl.
*G06F 30/398* (2020.01)

(52) U.S. Cl.
CPC ................... *G06F 30/398* (2020.01)

(58) Field of Classification Search
CPC .... G03F 1/36; G03F 7/70433; G03F 7/70441; G03F 7/70666; G03F 1/70; G03F 1/84; G03F 7/705; G03F 7/7065; G03F 1/78; G03F 7/70425; G06F 30/398; G06F 30/392; G06F 30/39; G06F 2119/06; G06F 30/36; G06F 30/394; G06F 30/20; G06F 30/327;

(Continued)

(56) References Cited

U.S. PATENT DOCUMENTS 6,978,437 B1 * 12/2005 Rittman ............... G03F 1/36
700/121
8,924,896 B2 * 12/2014 Wang ............... G06F 30/398
716/54

(Continued)

OTHER PUBLICATIONS

Bandaragoda, T. R., Ting, K. M., Albrecht, D., Liu, F. T., Zhu, Y., & Wells, J. R. (2018). "Isolation-based anomaly detection using nearest-neighbor ensembles." Computational Intelligence, 34(4), 968-998.

(Continued)

*Primary Examiner* — Binh C Tat
(74) *Attorney, Agent, or Firm* — FOLEY & LARDNER LLP

(57) ABSTRACT

A system and method for fixing DRC violations includes receiving a layout pattern having a design rule check (DRC) violation therein, determining that the layout pattern is an inlier based upon a comparison of the layout pattern with a plurality of previously analyzed layout patterns. The comparison may be performed by an anomaly detection algorithm. The system and method may also include selecting a recipe from a pool of recipes previously applied to the plurality of previously analyzed layout patterns for fixing the DRC violation in the layout clip upon determining that the layout pattern is an inlier.

19 Claims, 12 Drawing Sheets

(58) Field of Classification Search
CPC .............. G06F 2119/12; G06F 30/3312; G06F 30/367; G06F 17/175; G06F 2111/04; G06F 2119/18; G06F 30/31; G06F 30/3947; G06F 11/3644; G06F 2111/20; G06F 30/18; G06F 30/27; G06F 30/33; G06F 30/331; G06F 30/3953; G06F 30/323; G06F 2113/20; G06F 2113/24; G06F 2117/12; G06F 2119/22; G06F 30/17; G06F 30/373; G06F 2117/06; H01L 2027/11875; H01L 27/0207; H01L 23/485; H01L 23/535; H01L 27/11807; H01L 29/41791; H01L 29/41733; H01L 27/092; H01L 23/5227; H01L 23/5226; H01L 23/528; H01L 23/5283; H01L 25/16; H01L 27/0688
USPC .................................................. 716/110–116
See application file for complete search history.

(56) References Cited

U.S. PATENT DOCUMENTS

| | | | |
|---|---|---|---|
| 9,262,570 B2* | 2/2016 | Hsu | G06F 30/392 |
| 10,713,411 B1 | 7/2020 | Chang | |
| 11,042,806 B1* | 6/2021 | Jiang | G06F 30/398 |
| 11,443,097 B2* | 9/2022 | Huang | G06F 30/398 |
| 2009/0106715 A1* | 4/2009 | Pikus | G06F 30/398 |
| | | | 716/111 |
| 2018/0121594 A1* | 5/2018 | Studders | G06F 30/398 |
| 2020/0104457 A1* | 4/2020 | Chuang | G06F 30/327 |

OTHER PUBLICATIONS

T. Chen, S. Kornblith, M. Norouzi and G.Hinton. "A Simple Framework for Contrastive Learning of Visual Representations" In arXiv:2002.05709, 2020.

* cited by examiner

| Total | | Outlier | | Infer | | Suggested recipe | Rank (Decreasing order) | |
|---|---|---|---|---|---|---|---|---|
| PV rule name | Number (N_t) | #DRC | Percentage p_o | FR_o | Percentage p_i | FR_i | | Log(N_t) * ((1-FR_o)*p_o+0.85*((1-FR_i)*p_i)) | rank |

DLC outlier report - #total clips= 635(L1:105, L2:530)

* Analysis output path= /FSIM/SOIC_3DICTV_BE_20211231_1/users/uchuangn/DLC/dlc_0712_p128
* #outliers= 37
* Outlier PV rule name summary

| PV rule name | #DRC | FR | #outliers | Percentage outlier FR | | Suggested recipe | infra FR | Best fitted recipe | rank |
|---|---|---|---|---|---|---|---|---|---|
| M3.CS.0.1 | 13 | 0.705 | | 23.08 | 0.778 | 76.92 | 0.684 | EDA(NoRecipe) | 66.136 |
| M1.CS.5.3 | 43 | 0.872 | | 9.3 | 0.0 | 90.7 | 0.962 | Add_RBLK(0.074_0.074_0.12_0.12) | 45.998 |
| M3.S.4.1 | 94 | 0.9 | | 0.0 | 1.0 | 100.0 | 0.9 | Move_Cell(none) | 38.618 |
| M3.CS.1.1.3.CA | 8 | 0.79 | | 62.5 | 0.933 | 37.5 | 0.55 | EDA(NoRecipe) | 38.535 |
| M3.CS.5.1 | 92 | 0.908 | | 0.0 | 1.0 | 100.0 | 0.908 | Move_Cell(none) | 35.36 |
| M3.CS.0.2 | 19 | 0.872 | | 73.68 | 0.952 | 26.32 | 0.647 | EDA(NoRecipe) | 33.667 |
| M3.S.2 | 3 | 0.889 | | 100.0 | 0.889 | 0.0 | 1.0 | | 12.195 |
| M3.CS.1.1.3.CB | 8 | 0.966 | | 62.5 | 0.945 | 37.5 | 1.0 | EDA(NoRecipe) | 7.148 |
| M1.S.4.2 | 264 | 0.994 | | 0.0 | 1.0 | 100.0 | 0.994 | Add_RBLK(0.02_0.02_0.12_0.12) | 2.844 |
| M3.S.1 | 3 | 1.0 | | 100.0 | 1.0 | 0.0 | 1.0 | | 0.0 |
| N2.S.3.2 | 28 | 1.0 | | 0.0 | 1.0 | 100.0 | 1.0 | Add_RBLK(0_0_0.076_0.076) | 0.0 |

FIG. 11

SYSTEM AND METHOD FOR DIAGNOSING DESIGN RULE CHECK VIOLATIONS

CROSS-REFERENCE TO RELATED APPLICATION

This application is related to and claims priority under 35 U.S. § 120 as a continuation application of U.S. Utility application Ser. No. 17/103,748, filed Nov. 24, 2020, titled "SYSTEM AND METHOD FOR DIAGNOSING DESIGN RULE CHECK VIOLATIONS," the entire contents of which are incorporated herein by reference for all purposes.

BACKGROUND

The present disclosure relates generally to signal routing, and particularly to signal routing on a back side of a semiconductor substrate.

The recent trend in miniaturizing integrated circuits (ICs) has resulted in smaller devices which consume less power yet provide more functionality at higher speeds than before. In one aspect, the miniaturization in ICs is achieved by advancement in fabrication processes. For example, over millions or billions of circuit components (e.g., transistors) can be formed in a small area (e.g., less than 100 mm$^2$). To ensure that components of an IC can be fabricated as designed through complex fabrication processes, various electronic design automation (EDA) tools are utilized.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is an example of a DRC summary report generated by the DRC verification system of FIG. 10, in accordance with some embodiments.

DETAILED DESCRIPTION

Figure 1:
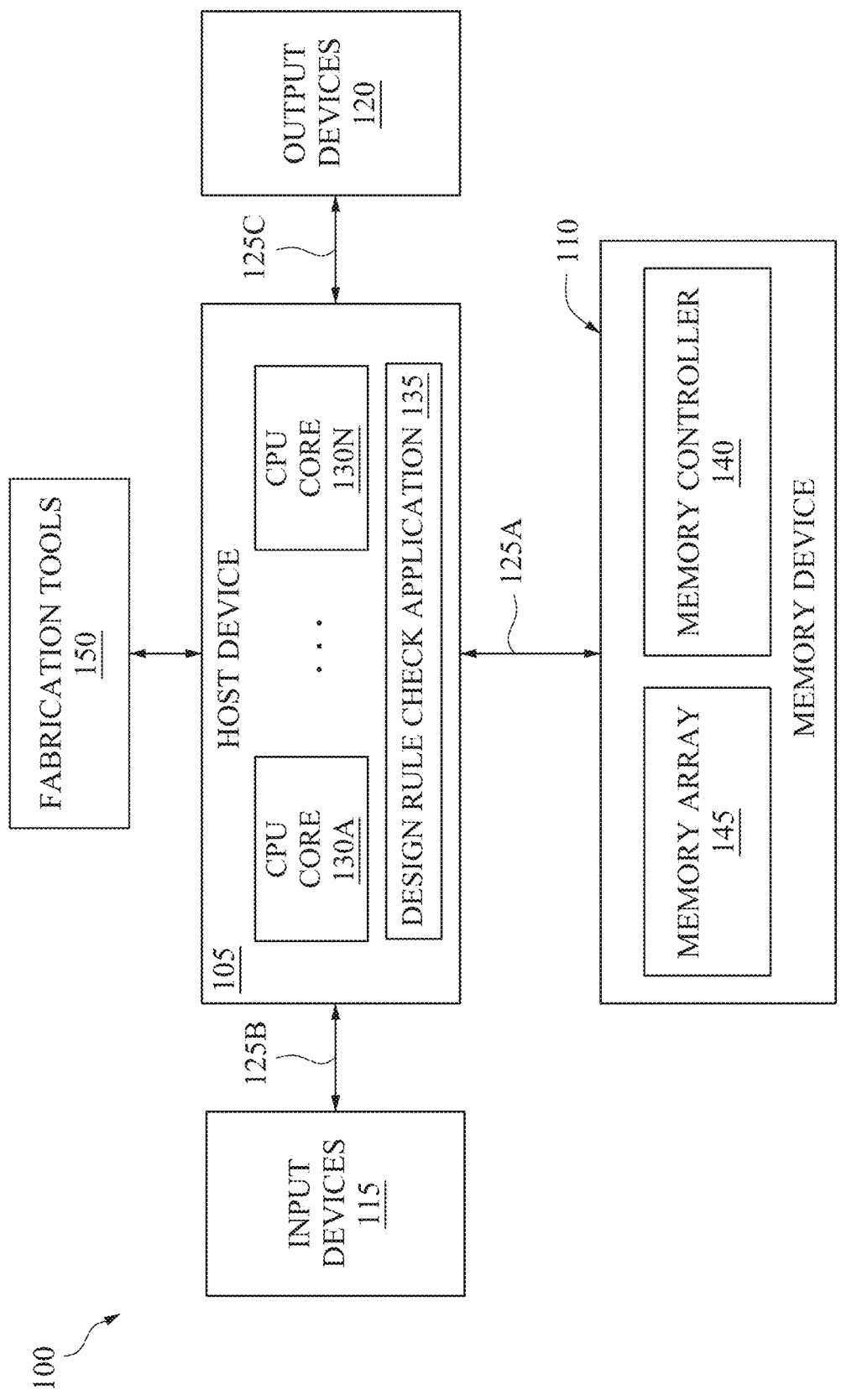
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" or "integrated circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

One such application that the host device 105 may be configured to run may be a design rule check application 135. The design rule check application 135 may be part of a computer aided design or electronic design automation software suite that may be used by a user of the host device 105 to analyze a layout pattern of a circuit for one or more design rule check ("DRC") violations and identify a recipe for resolving each of the one or more DRC violations. A layout pattern of the circuit may show various components and connections of the circuit to be fabricated. For example, the layout pattern may show one or more active regions, gate electrodes, source and drain electrodes, metal lines, via contacts, openings for bonding pads, one or more metal layers, power sources, input and output signals, clock signals, etc. representing the various components of the circuit, and how those components are interconnected when disposed in/on a semiconductor substrate (such as a silicon wafer). The layout pattern may be implemented by following a design procedure that may include one or more of logic design, physical design, or place and route. The layout pattern may be expressed in one or more data files such as GDSII file format or DFII file format. In other embodiments, other file formats may be used.

In some embodiments, layout patterns may be verified to ensure that the layout pattern functions properly and as desired. In some embodiments, the verification of the layout pattern may be performed by using Design Rule Check (DRC) verification. The DRC verification includes a series of design rules that verify a spacing between two layout components, verify a pitch or spacing between two layout components, verify width or length of a side of a layout component, etc. Generally speaking, DRC verification may check for compliance with various geometric and connection restrictions to ensure that the layout pattern operates reliably. In some embodiments, the design rule check application 135 may be used to perform the DRC verification. Specifically, in some embodiments, the design rule check application 135 may be used to identify one or more DRC violations in a layout pattern. In some embodiments, the design rule check application 135 may also be used to identify one or more recipes to fix the identified one or more DRC violations. A "recipe" may be considered a solution that fixes a particular DRC violation. In some embodiments, there may be single recipe that fixes a particular DRC violation. In other embodiments, there may be multiple suitable recipes for fixing a particular DRC violation. The design rule check application 135 may also be used to identify the most suitable recipe to be applied to a particular DRC violation.

Thus, a circuit designer may create a layout pattern of a circuit. Then, using the design rule check application 135, the circuit designer may identify and resolve one or more DRC violations in that layout pattern. In some embodiments, the instructions needed to execute or run the design rule check application 135 may be stored within the memory device 110. The design rule check application 135 may be executed by one or more of the CPU cores 130A-130N using the instructions associated with the design rule check application from the memory device 110.

Referring still to FIG. 1, the memory device 110 includes a memory controller 140 that is configured to read data from or write data to a memory array 145. In some embodiments, the memory array 145 may include a variety of volatile and/or non-volatile memories. For example, in some embodiments, the memory array 145 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 145 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein.

The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the design rule check application 135 stored in the memory array 145 of the memory device 110 upon receiving a request from the host device 105.

In some embodiments, the computing system 100 may also be associated with various fabrication tools 150. Among other things, the fabrication tools 150 may be used to prepare and fabricate a set of masks based on the standard cell layout (e.g., the layout pattern). The set of masks may define the geometry for the photolithography steps used during semiconductor fabrication of the circuit. Although the fabrication tools 150 are shown separate from the host device 105, in some embodiments, at least some of the functionality of the fabrication tools may be implemented by the host device such as by the design rule check application 135 or another application associated with the design rule check application.

To prepare a set of masks, the fabrication tools 150 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction ("OPC") using lithography enhancement techniques to compensate for image errors, such as those that can arise from diffraction, interference, other process effects and the like, in the standard cell layout. In some embodiments, a mask rule checker ("MRC") of the fabrication tools 150 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques ("RET"), such as off-axis illumination, sub-resolution assist features, phase-shifting masks, other suitable techniques, and the like or combinations thereof.

The preparation of the set of masks may further include, in some embodiments, lithography process checking ("LPC") that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet ("UV") beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 150 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may each include other hardware, software, and/or firmware components that are considered necessary or desirable in performing the functions described herein.

Figure 2:
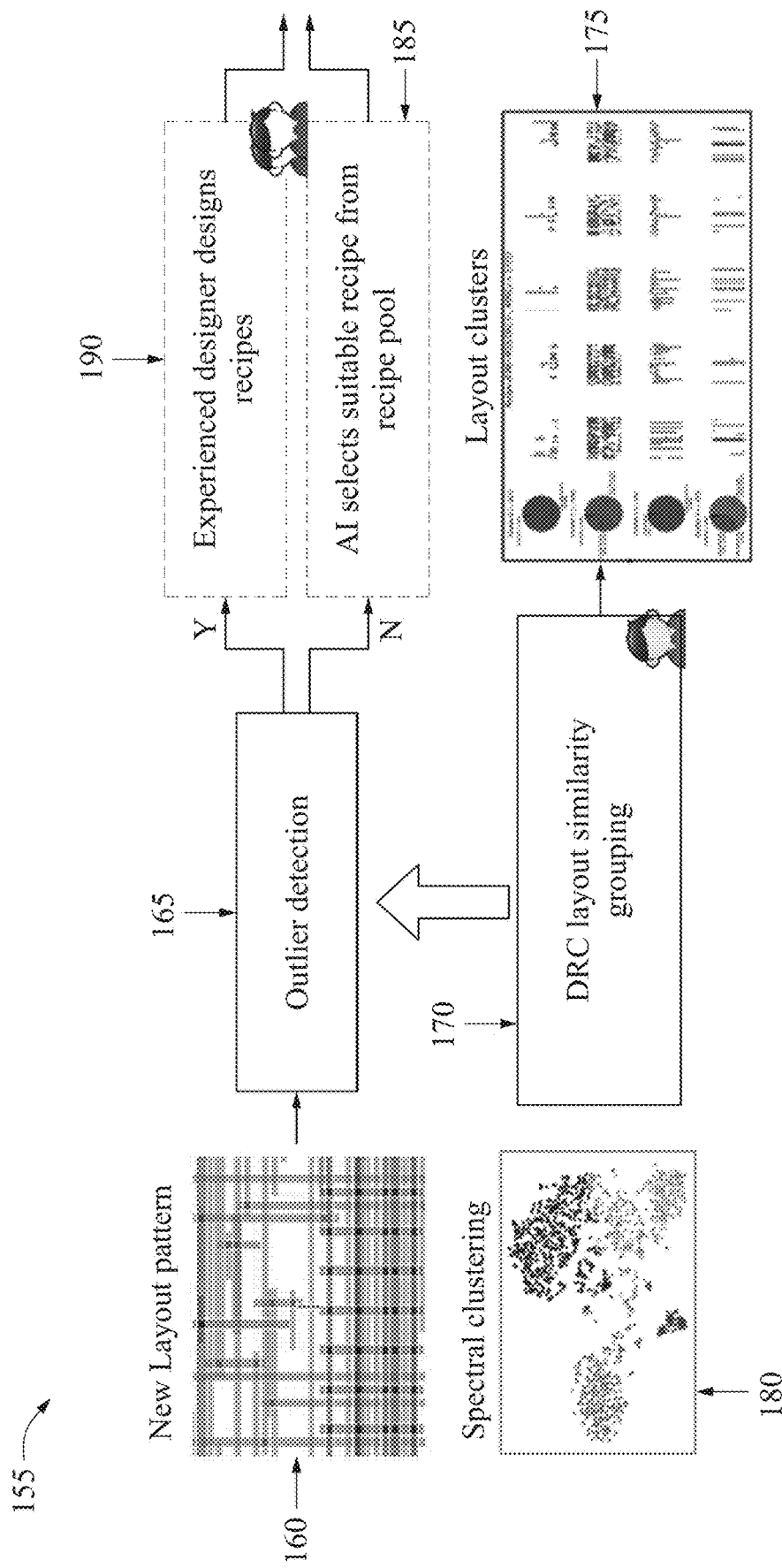
FIG. 2 is an example block diagram of a Design Rule Check (DRC) verification system, in accordance with some embodiments.

Turning to FIG. 2, an example DRC verification system 155 for performing DRC verification is shown, in accordance with some embodiments of the present disclosure. In some embodiments, at least some portions of the DRC verification system 155 may be implemented by the design rule check application 135. The DRC verification system 155 is configured to automatically identify one or more DRC violations in a layout pattern of a layout clip 160. The layout clip 160 may be input into the design rule check application 135. Specifically, in some embodiments, the DRC verification system 155 and the design rule check application 135 may perform outlier detection 165 to determine whether the layout pattern of the layout clip 160 is an "outlier" or an "inlier." An "outlier" is a layout pattern having a DRC violation which is not similar to (e.g., does not match with) other DRC violations in layout patterns that the DRC verification system 155 has previously corrected DRC violations for. An "inlier" is a layout pattern having a DRC violation that is similar to (e.g., matches with) other DRC violation(s) in layout patterns that the DRC verification system has previously corrected DRC violations for. In some embodiments, two layout patterns may be considered "similar" if the layout patterns have similar layout features (e.g., similar DRC violations). In some embodiments, the criteria for determining that one layout pattern is similar to another layout pattern may be predetermined and preprogrammed within the DRC verification system 155.

In some embodiments, the DRC verification system 155 may perform the outlier detection 165 by performing a DRC layout similarity grouping 170. The DRC layout similarity grouping 170 may identify one or more layout clusters 175 of previously analyzed DRC layout patterns to which the layout pattern in the layout clip 160 may be similar to. In some embodiments, the DRC layout similarity grouping 170 to identify the one or more layout clusters 175 may be performed using spectral clustering 180. The DRC layout similarity grouping 170 is discussed in greater detail below. In some embodiments, the DRC layout similarity grouping 170, the identification of the one or more layout clusters 175, and/or the spectral clustering 180 may be performed by a machine learning/artificial intelligence algorithm. For example, in some embodiments, an anomaly detection algorithm may be used. In some embodiments, the anomaly detection algorithm may include at least one of a k-nearest neighbor classifier, a random forest classifier, or an isolation forest classifier. In other embodiments, other or additional anomaly detection algorithms may be used, including for example, a fuzzy logic-based outlier detection algorithms. In yet other embodiments, other types of machine learning/artificial intelligence algorithms may be used for performing the outlier detection 165 and/or for recipe selection.

Upon determining whether the layout pattern in the layout clip 160 is an outlier or inlier, the DRC verification system 155 may decide how to correct the DRC violations in the layout pattern of the layout clip 160. If the layout pattern of the layout clip 160 is an inlier, the DRC verification system identifies/selects a suitable recipe from a pool of recipes to correct the DRC violations in that layout pattern, as shown in block 185. In some embodiments, the selection of the suitable recipe may be performed by one or more machine learning/artificial intelligence algorithms, such as those mentioned above. Recipe selection is also discussed in greater detail below. On the other hand, if the DRC verification system 155 determines that the layout pattern in the layout clip 160 is an outlier, then the DRC verification system sends the layout clip 160 to a designer to review the layout pattern and correct the DRC violations in the layout clip 160, as shown in block 190.

Current DRC violation correction techniques rely only on designer experience in identifying DRC violations and selecting suitable recipes. A designer may spend a significant amount of time and resources in analyzing similar layout patterns and designing recipes. Further, such manual building rule-based methods may be inefficient and inconvenient. Additionally, manual review does not have the ability to determine whether the selected recipe is a suitable recipe for fixing a particular DRC violation or nor until after that recipe has been applied to the DRC violation, resulting in additional time consumption and delay. Manual review also does not have the ability to rank pattern violations and analyze potential recipe inconsistencies. Thus, currently used DRC verification mechanisms are inadequate.

In contrast, correction of DRC violations by the DRC verification system 155 is efficient, quick, and minimizes analysis efforts. The DRC verification system 155 is configured to recognize layout patterns, select suitable recipes based on recipes that previously successfully corrected a particular DRC violation, automatically predict suitable recipes based on layout features in the layout pattern, detect outliers, and analyze recipe inconsistencies. Further, inventors have found that the DRC verification system 155 has a high rate of accuracy in predicting and selecting a suitable recipe for a particular DRC violation. For example, inventors have found that when the DRC verification system 155 predicts and selects a recipe having a highest fix rate from recipes previously applied to similar layout patterns, the accuracy is about 90%. Inventors have also found that this high accuracy may be achieved by the DRC verification system 155 with about 85% less effort compared to a manual review. For example, the DRC verification system 155 may be configured to analyze over 4000 DRC violations in about 1 minute. Thus, the DRC verification system 155 provides a fast, convenient, accurate, and efficient mechanism for analyzing DRC violations.

Figure 3:
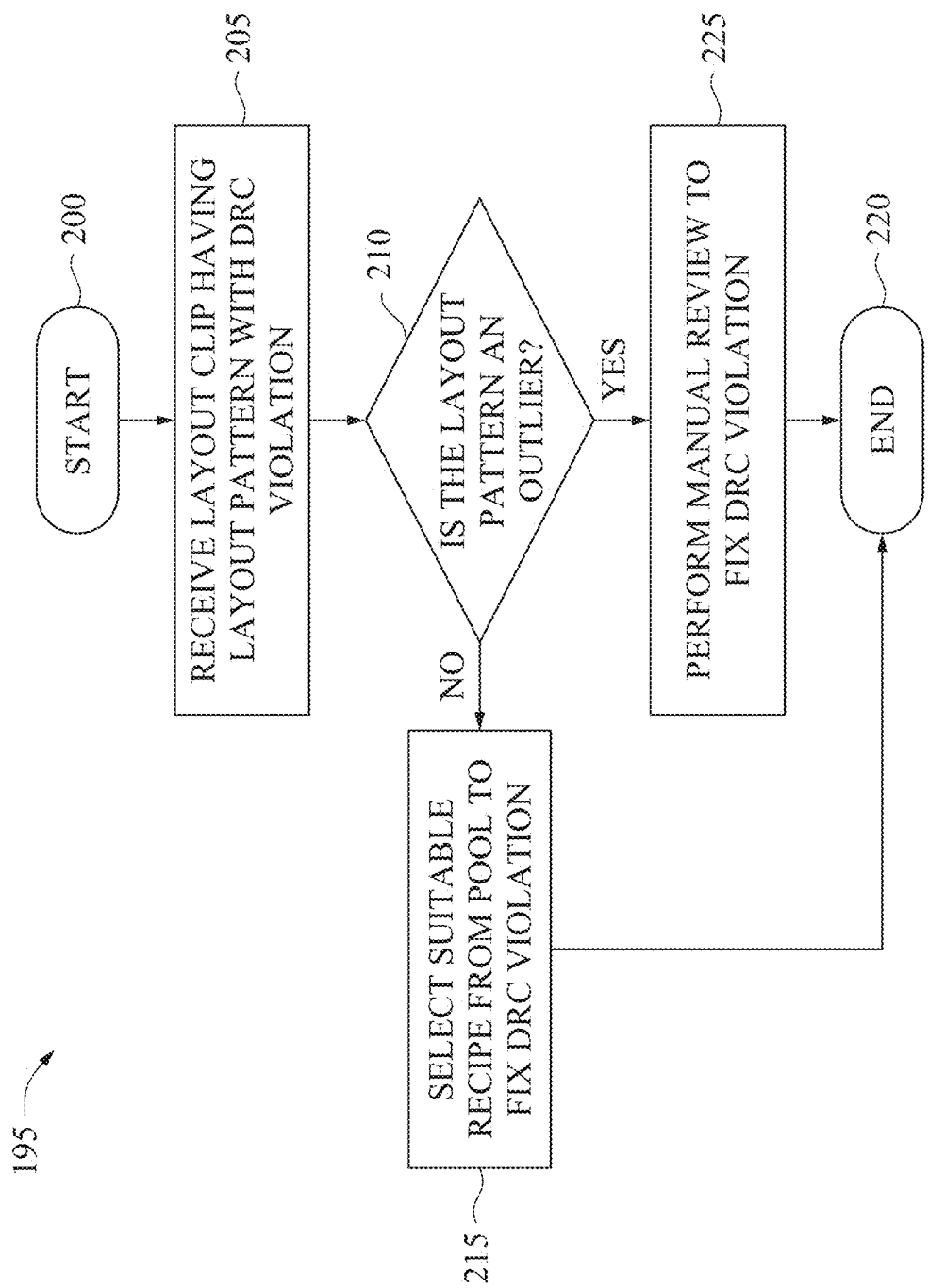
FIG. 3 is an example flowchart outlining operations of a process implemented by the DRC verification system of FIG. 2 for fixing a DRC violation in a layout clip, in accordance with some embodiments.

Referring to FIG. 3, an example flowchart outlining a process 195 is shown, in accordance with some embodiments of the present disclosure. The process 195 may be implemented by the DRC verification system 155 (e.g., the design rule check application 135 implementing the DRC verification system) for analyzing the layout pattern of the layout clip 160. The process 195 may include other or additional operations depending upon the particular embodiment. To analyze the layout pattern of the layout clip 160, the process 195 starts at operation 200 and receives the layout clip 160 at operation 205. The layout pattern of the layout clip 160 may have one or more DRC violations that need to be corrected. At operation 210, the DRC verification system 155 determines whether the layout pattern of the layout clip 160 is an outlier or inlier. Upon determining that the layout pattern is an inlier (e.g., not an outlier), the DRC verification system 155 selects one or more recipes from a pool of recipes for fixing the DRC violations in the layout clip 160 at operation 215. The DRC verification system 155 may then apply the selected recipe(s) to the layout pattern of the layout clip 160 to correct the DRC violations. The process 195 then ends at operation 220 waiting to analyze another layout pattern.

If, at the operation 210, the DRC verification system 155 determines that the layout pattern in the layout clip 160 is an outlier, the DRC verification system concludes that the DRC violations in the layout pattern need to be manually reviewed. Thus, the process 195 proceeds to operation 225 if the operation 210 determines that the layout pattern in the layout clip 160 is an outlier. The process 195 ends at the operation 220.

Figure 4:
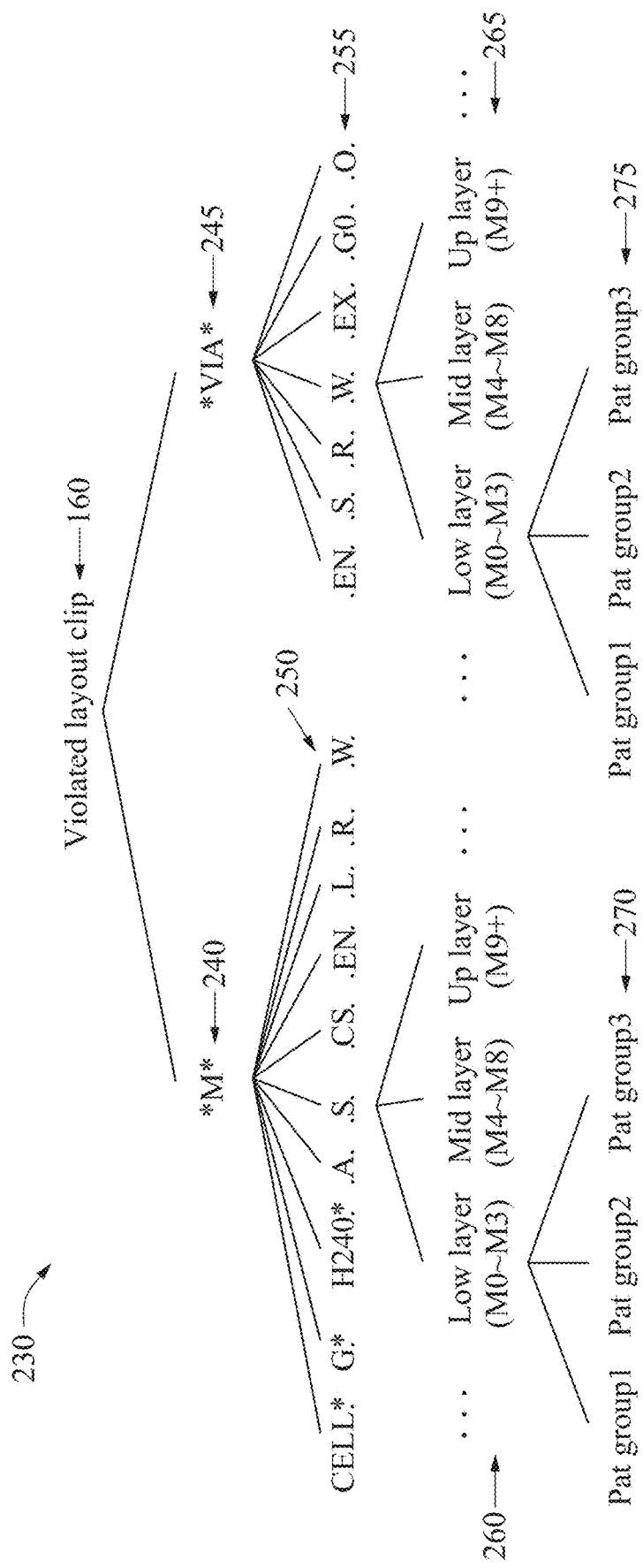
FIG. 4 is an example classification of the DRC violation in the layout clip of FIG. 3 for performing outlier detection and recipe selection for fixing the DRC violation in the layout clip, in accordance with some embodiments.

Referring to FIG. 4, an example classification 230 for performing the DRC layout similarity grouping 170 is shown, in accordance with some embodiments of the present disclosure. The classification 230 may be implemented by the DRC verification system 155 (e.g., the design rule check application 135). The classification 230 may include identifying a location of the DRC violation in the layout pattern of the layout clip 160. The classification 230 may be used by the DRC verification system 155 to determine whether the layout pattern of the layout clip 160 is an outlier or inlier, identify a group of previously analyzed layout clips having DRC violations similar to the DRC violation in the layout clip 160, as well as select a suitable recipe for fixing the DRC violation in the layout clip 160. In some embodiments, the DRC verification system 155 may classify the layout clip 160 based upon three criteria: layout pattern type, violation type, and layer at which the DRC violation occurs.

Thus, to perform the classification 230 and determine the location of the DRC violation in the layout pattern of the layout clip 160, in some embodiments, the DRC verification system 155 may first determine whether the DRC violation occurs in a metal interconnect layer or a via structure. Violations in the metal interconnect layer or the via structure may be considered "layout pattern type" violations. In other embodiments, the layout pattern type may include other types of layout pattern type violations. Thus, in some embodiments, the DRC verification system 155 may determine whether the DRC violation in the layout clip 160 is in a metal interconnect ("M") 240 or a via structure ("VIA") 245.

Upon determining whether the DRC violation in the layout clip 160 is in the metal interconnect 240 or the via structure 245, the DRC verification system 155 may further determine a particular violation type of the DRC violation. Specifically, each of the metal interconnect 240 and the via structure 245 categories may be further sub-classified into one or more violation types. A violation type may identify a type of the DRC violation. Example violation types are shown in Table 1 below:

| Violation type | Full name |
| --- | --- |
| S | Spacing |
| A | Area |
| L | Length |
| R | Recommended |
| W | Width |
| O | Overlap |
| EN | Enclose |
| CS | Color spacing |
| EX | Extension |
| G0 | Double pattern rule |
| CELL | Not specifically defined |
| G | Graph |
| H240 | Cell high 240 |

In other embodiments, other or additional violation types may be used. In some embodiments, certain violation types may occur only in the metal interconnect 240 while other violation types may occur only in the via structure 245. In yet other embodiments, certain types of violation types may occur in both the metal interconnect 240 and the via structure 245. Thus, although certain violation types 250 are shown for the metal interconnect 240 and certain violation types 255 are shown for the via structure 245, in other embodiments, each of the violation types 250 and 255 may include additional or other violation types.

Further, each violation type may be further sub-classified into a group of metal interconnect layers at which the violation type occurs. For example, in some embodiments, each violation type may be further sub-classified into a "low layer," a "mid layer," or an "up layer." A "low layer" may mean a DRC violation that occurs in metal interconnect layers M0-M3, a "mid layer" may mean a DRC violation that occurs in metal interconnect layers M4-M8, and an "up layer" may mean a DRC violation that occurs in metal interconnect layers M9 and up. In other embodiments, the "low layer," "mid layer," and "up layer" may include different interconnect layers than those mentioned above. Further, although the metal interconnect layers have been sub-divided into three layers (e.g., "low layer," "mid layer," and "up layer"), in other embodiments, the metal interconnect layers may be subdivided into greater than or fewer than 3 layers. Thus, each violation type may be further sub-classified into the layer at which the DRC violation occurs.

Further, although FIG. 4 shows only the "S" violation type of the violation types 250 in the metal interconnect 240 as being sub-divided into layers 260 (e.g., the "low layer," "mid layer," and "up layer"), in other embodiments, the other violation types 250 may also be similarly sub-divided, with each violation type being sub-classified into one or more of the layers 260. Likewise, although the "W" violation type of the violation types 255 of the via structure 245 is shown as being subdivided into layers 265 (e.g., the "low layer," "mid layer," and "up layer"), in other embodiments, the other violation types 255 of the via structure may also be similarly sub-divided, with each violation type being sub-classified into one or more of the layers 265.

Thus, to analyze the layout clip 160 and perform the classification 230, the DRC verification system 155 may first identify whether the DRC violation in the layout pattern of that layout clip occurs in the metal interconnect 240 or the via structure 245. Upon identifying the pattern layout type (e.g., the metal interconnect 240 or the via structure 245), the DRC verification system 155 may determine the violation type of that pattern layout type. For example, if the DRC verification system 155 determines that the layout clip 160 has a DRC violation in the metal interconnect 240, the DRC verification system may then identify one of the violation types 250 for the DRC violation. Upon identifying one of the violation types 250, the DRC verification system 155 may then determine which one of the layers 260 does the violation type fall under. For example, if the DRC verification system 155 determines that the layout clip 160 has a spacing ("S") DRC violation of the violation types 250, the DRC verification system may then determines whether the spacing DRC violation occurs in the "low layer," "mid layer," and "up layer" of the layers 260. For example, if the DRC verification system 155 determines that the layers 260 in which the DRC violation has occurred is in the "low layer," the DRC verification system 155 may classify the layout clip as "M_S_low."

Figure 5:
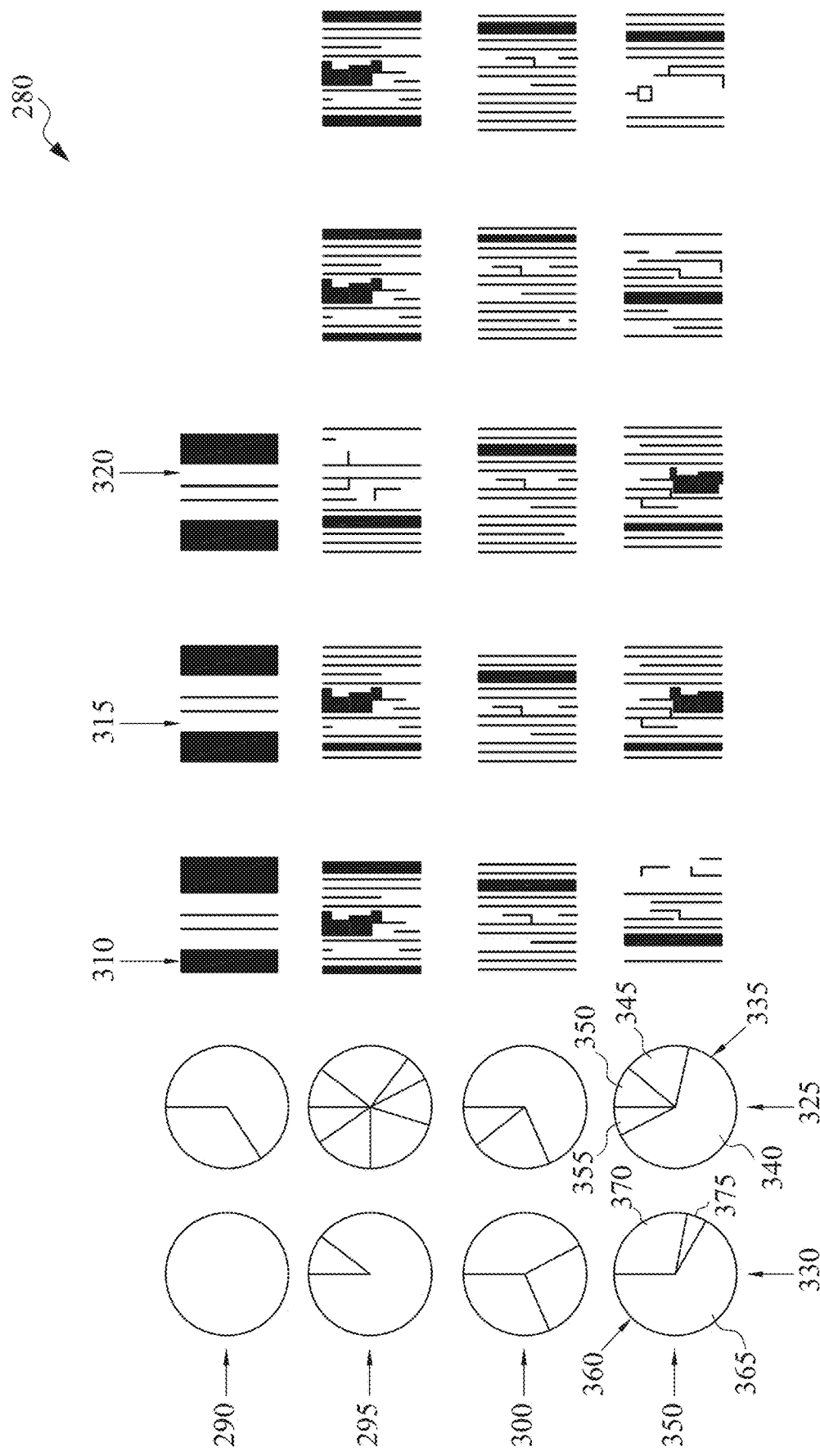
FIG. 5 is an example block diagram showing clusters of previously analyzed layout clips having DRC violations that are similar to the DRC violation in the layout clip of FIG. 3 for performing the outlier detection and recipe selection, in accordance with some embodiments.

In some embodiments, the layout clip 160 may have a single DRC violation or multiple DRC violations. In such embodiments, the classification 230 may be performed for each DRC violation in the layout pattern of the layout clip 160. Thus, in some embodiments, the layout clip 160 may have multiple classifications (e.g., M_S_low) depending upon the number and types of DRC violations. Further, in some embodiments, each layer in the layers 260 and 265 may be further classified into one or more groups 270 and 275, respectively. Although three groups are shown in each of the groups 270 and 275, in other embodiments, each layer in the layers 260 and/or 265 may be sub-divided into greater than or fewer than 3 groups. Further, although only the "low layer" of the layers 260 and 265 is shown as being sub-divided into the groups 270 and 275, respectively, in other embodiments, the "mid layer" and/or the "up layer" may be similarly sub-divided. Each group in the groups 270 and 275 may identify other layout patterns that have a similar layout pattern as the layout clip 160 (e.g., have DRC violations that are similar to the DRC violation of the layout clip 160). Each group in the groups 270 and 275 may include one or more "clusters." Examples of a group are shown in FIG. 5 below. Such "clustering" of the layout clip 160 may be used to determine whether the layout pattern in the layout clip 160 is an outlier, as well as help with recipe prediction/selection.

Turning to FIG. 5, an example of a group 280 is shown, in accordance with some embodiments of the present disclosure. The group 280 may be one of the three groups in the groups 270 or 275 of FIG. 4. In some embodiments, the group 280 may be identified based upon classification. For example, in some embodiments, the DRC verification system 155 may identify a group of previously analyzed layout patterns for the group 280 from a pool of previously analyzed layout patterns that have the same or similar classification as the classification 230 of the layout clip being analyzed (e.g., the layout clip 160). In other embodiments, the DRC verification system 155 may form the group 280 using other ways. For purposes of explanation, the group 280 is assumed to correspond to the layout clip 160.

Further, the group 280 may include one or more clusters. For example, and as shown in FIG. 5, the group 280 may include 4 clusters 290-305. Although four clusters (e.g., the clusters 290-305) are shown in the group 280, in other embodiments, that group may include greater than or fewer than 4 clusters. In some embodiments, the DRC verification system 155 may be configured to generate the group 280 with a predefined number of clusters therein. Each of the clusters 290-305 may include one or more layout patterns (e.g., layout clips) having similar DRC violations. For example, in some embodiments, the cluster 290 may include three layout patterns, while the clusters 295-305 may each include four layout patterns. The number of layout patterns in each cluster may vary from one embodiment to another.

The layout patterns in a particular row (e.g., in a particular cluster) may imply that their layout patterns are similar. In other words, the layout patterns in a particular cluster may have similar DRC violations. For example, layout patterns 315-320 in the cluster 290 may have similar DRC violations. Similarly, the layout patterns in the cluster 295 may have similar DRC violations, the layout patterns in the clusters 300 may have similar DRC violations, and so on. Further, in some embodiments, the layout patterns of one cluster may be somewhat different from the layout patterns in another cluster. For example, the layout patterns 310-320 of the cluster 290 may have similar DRC violations, which may be somewhat different from the DRC violations in the layout patterns of the clusters 295-305. In some embodiments, the clusters 290-305 may be identified by a machine learning/artificial intelligence algorithm, such as those mentioned above.

Further, in some embodiments, by using an anomaly detection algorithm, the DRC verification system 155 may determine whether the layout clip 160 is a member of one of the clusters 290-305. If the DRC verification system 155 determines that the layout pattern of the layout clip 160 is similar to the layout patterns in one of the clusters 290-305, the DRC verification system may determine that the layout clip is a member of that cluster, and therefore, an inlier. On the other hand, if the DRC verification system 155 determines that the layout pattern of the layout clip 160 is not similar to the layout patterns in any of the clusters 290-305, the DRC verification system may determine that the layout clip is not a member of any cluster, and therefore, an outlier. Thus, by performing grouping/clustering of the layout clip 160, the DRC verification system 155 may determine whether the layout clip is an outlier or inlier.

In addition to including layout patterns, each of the clusters 290-305 may also include a pattern violation graph 325 and a recipe fix rate graph 330. In some embodiments, each of the pattern violation graph 325 and a recipe fix rate graph 330 may be a pie chart. In other embodiments, either or both of the pattern violation graph 325 and a recipe fix rate graph 330 may be represented in other graphical, textual, tabular, or other forms. The pattern violation graph 325 may identify various DRC violations that may have been encountered in the layout patterns in that cluster. In some embodiments, the pattern violation graph 325 may identify the classification 230 of the various DRC violations. For example, in some embodiments, the pattern violation graph 325 may identify whether the DRC violation is in the metal interconnect 240 or the via structure 245, the violation types, and the layers at which the DRC violations occur. In some embodiments, the classification 230 in the pattern violation graph 325 may also include the exact layer (e.g., M0, M1, M2, etc.) at which the DRC violation occurs. Thus, by looking at pattern violation graph 335 of the cluster 305, it may be determined that the layout patterns in that cluster has encountered a large number 340 (e.g., X percent) of DRC violations of a first type, and smaller numbers 345-355 of DRC violations of other types. Thus, the pattern violation graph 325 provides a quick view of the type and location of DRC violations that have occurred in the layout patterns of a particular cluster.

The recipe fix rate graph 330 identifies a "fix rate" of one or more recipes. "Fix rate" of a particular recipe may be defined as the success rate of that recipe. In other words, fix rate may be determined by dividing a number of DRC violations remaining after application of a recipe by the total number of DRC violations before application of the recipe (# of remaining DRC violations after recipe/# of total DRC violations before recipe). Higher fix rates are desired. When the fix rate of a first recipe is higher than the fix rate of a second recipe in the recipe fix rate graph 330, that indicates that the first recipe has been more successful in fixing a greater number of DRC violations in the layout patterns of that cluster. For example, in recipe fix rate graph 360, a first recipe 365 has a higher fix rate than recipes 370 and 375. Thus, the recipe 365 has been more successful in fixing a greater number of DRC violations of the layout patterns in the cluster 305 than the recipe 370, which in turn has been more successful in fixing the DRC violations than the recipe 375 in the cluster 305. By reviewing the pattern violation graph 325 and the recipe fix rate graph 330, the DRC verification system 155 may identify a suitable recipe to fix a particular DRC violation in the layout clip 160, predict the likelihood of success of applying that recipe to the layout clip, as well as evaluate DRC recipe inconsistencies.

Figure 6:
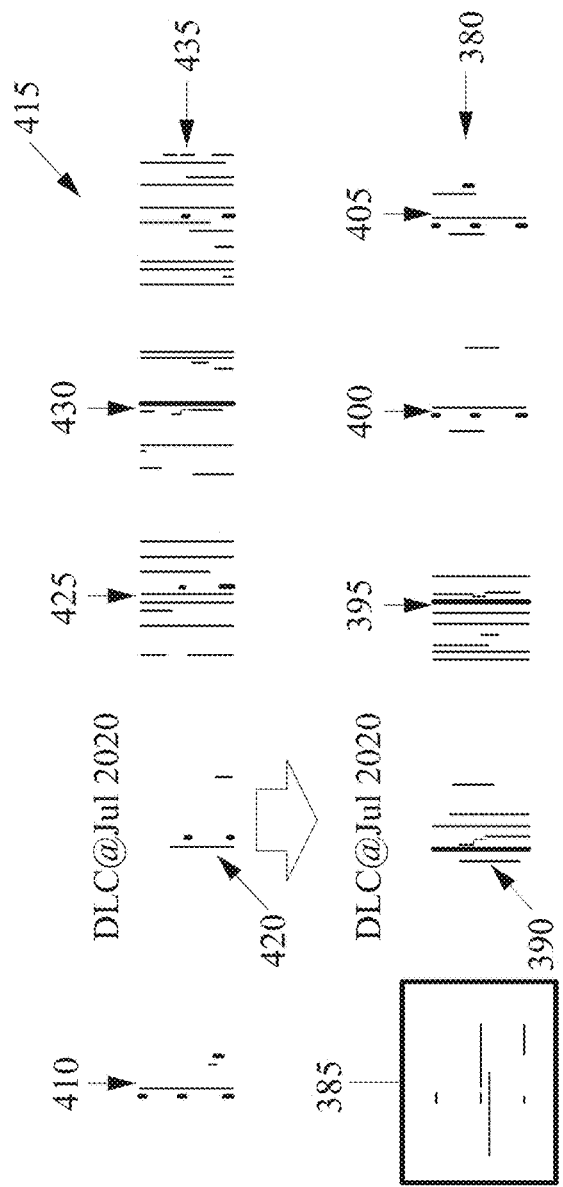
FIG. 6 is an example block diagram showing a data augmentation process to reduce instances of false outlier detections, in accordance with some embodiments.
Figure 6:
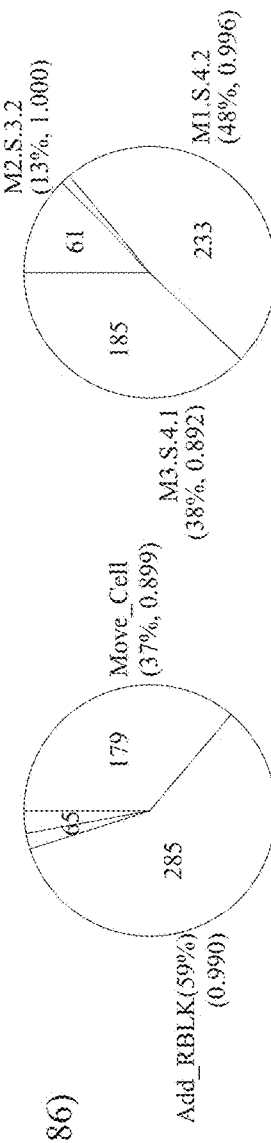
Figure 6:
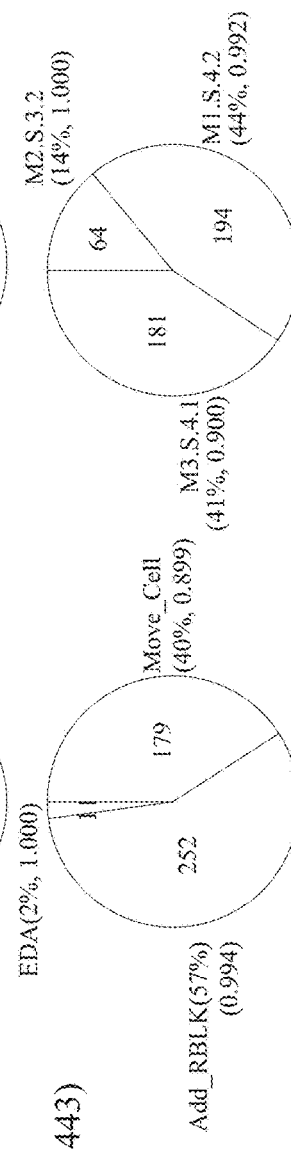
Figure 6:
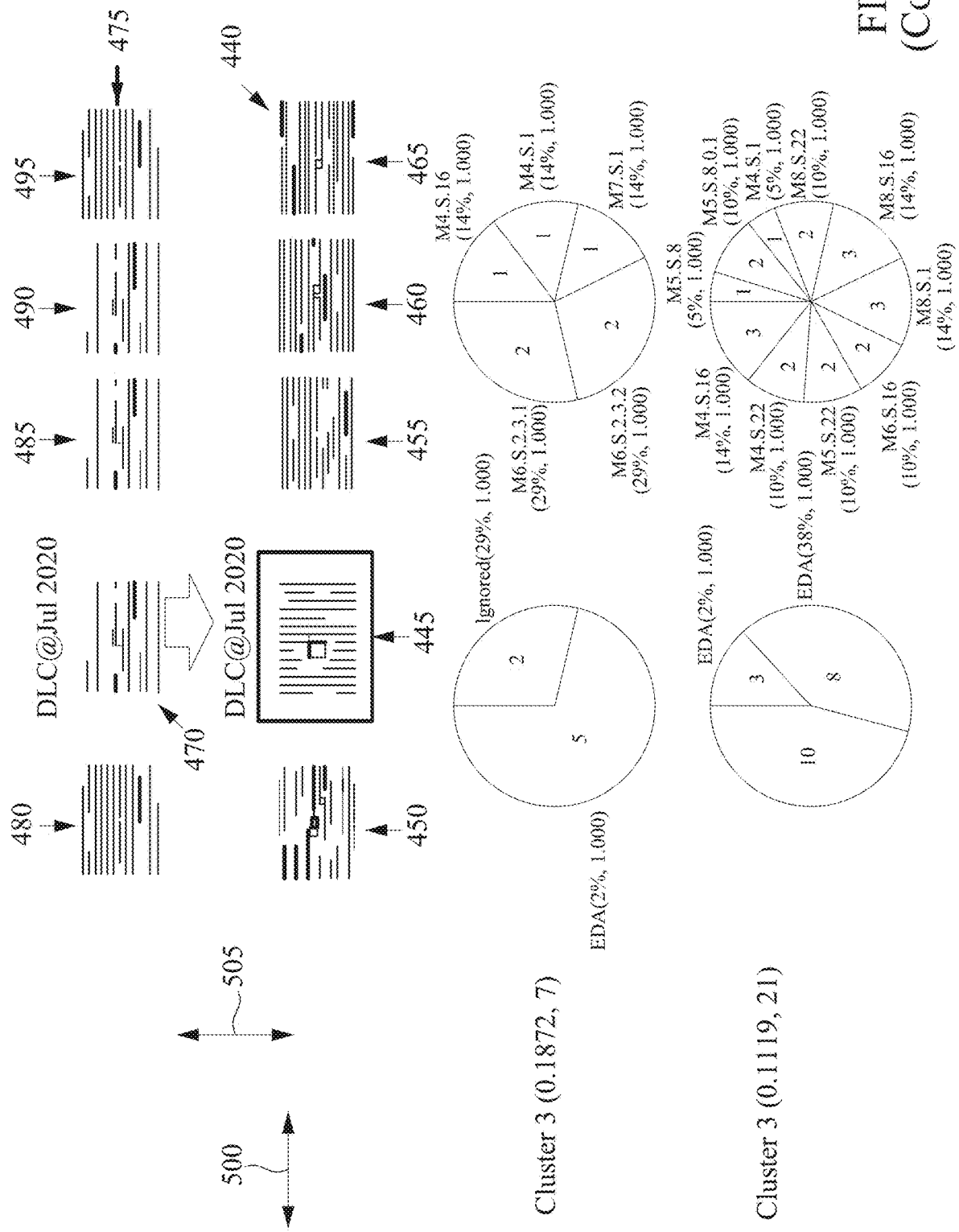

Turning to FIG. 6, a data augmentation mechanism is shown, in accordance with some embodiments of the present disclosure. Data augmentation may boost result robustness and lower outlier detection false alarms. In some embodiments, a layout pattern in a cluster may be oriented differently than the other layout patterns in that cluster. Such a differently oriented layout pattern may be determined as an outlier because that layout pattern may not appear similar to the other layout patterns in that cluster. For example, in cluster 380, layout pattern 385 is shown oriented differently than other layout patterns 390-405 in that cluster. Specifically, the layout pattern 385 is shown oriented in a horizontal orientation while the layout patterns 390-405 are oriented in a vertical orientation. Such a difference in orientations may result in the layout pattern 385 being determined an outlier even though the layout pattern has similar DRC violations as the DRC violations in the layout patterns 390-405. To avoid such false outlier detections, in some embodiments, when the orientation of a particular layout pattern (e.g., the layout pattern 385) is different from the orientation of the other layout patterns (e.g., the layout patterns 390-405) in a cluster (e.g., the cluster 380), the orientation of the layout pattern that is different may be changed.

For example, in some embodiments, the DRC verification system 155 may rotate the layout pattern 385 such that the layout pattern is oriented vertically, as shown in layout pattern 410 of cluster 415. Upon rotating, the layout pattern 410 is similarly oriented as layout patterns 420-435 of the cluster 415. Upon being oriented similarly, the DRC violations in the layout pattern 410 is similar to the DRC violations in the layout patterns 420-435, and therefore, the layout pattern 410 may not be considered an outlier. Thus, in some embodiments, by changing the orientation of a layout pattern from horizontal to vertical, the incidence of false outlier detections may be reduced.

Cluster 440 shows an example of a layout pattern 445 that is oriented vertically while layout patterns 450-465 of that cluster are oriented horizontally. In such cases, the layout pattern 445 may be considered an outlier because in the vertical orientation, that layout pattern does not appear similar to the layout patterns 450-465. However, if the layout pattern 445 is rotated to be oriented in a horizontal orientation, in some embodiments, that layout pattern may be considered an inlier. For example, when the layout pattern 445 is rotated to be horizontally oriented, as shown by layout pattern 470 in cluster 475, if that layout pattern is similar to layout patterns 480-495, then the layout pattern 470 may be considered an inlier instead of an outlier. Thus, in some embodiments, by changing the orientation of a layout pattern from vertical to horizontal, the incidence of false outlier detections may be reduced.

A "horizontal" orientation may be considered an orientation in which the various layout features (e.g., signal wires) extend in a horizontal or left-right direction, as shown by arrows 500. A "vertical" orientation may be considered an orientation in which the various layout features (e.g., signal wires) extend in a vertical or top-down direction, as shown by arrows 505. In some embodiments, changing the orientation from horizontal to vertical may be accomplished by rotating a layout pattern at least once by 90 degrees until the layout features (e.g., the signal wires) of that layout pattern are extending in a similar direction as the layout features (e.g., the signal wires) of other layout patterns in that cluster. Similarly, in some embodiments, changing the orientation from vertical to horizontal may be accomplished by rotating a layout pattern at least once by 90 degrees until the layout features (e.g., the signal wires) of that layout pattern are extending in a similar direction as the layout features (e.g., the signal wires) of other layout patterns in that cluster. In some embodiments, changing the orientation may include rotating or moving a layout pattern in other directions and/or at other angles.

Further, in some embodiments, the DRC verification system 155 may perform data augmentation automatically. In some embodiments, upon the creation of a cluster, the DRC verification system may review the orientation of the various layout patterns in that cluster. If the DRC verification system 155 determines that the orientation of one or more layout patterns is different from the orientation of other layout patterns, in some embodiments, the orientation of the layout patterns may be changed until all of the layout patterns in that cluster are oriented similarly. Thus, data augmentation may lower incidences of false outlier detection.

Figure 7:
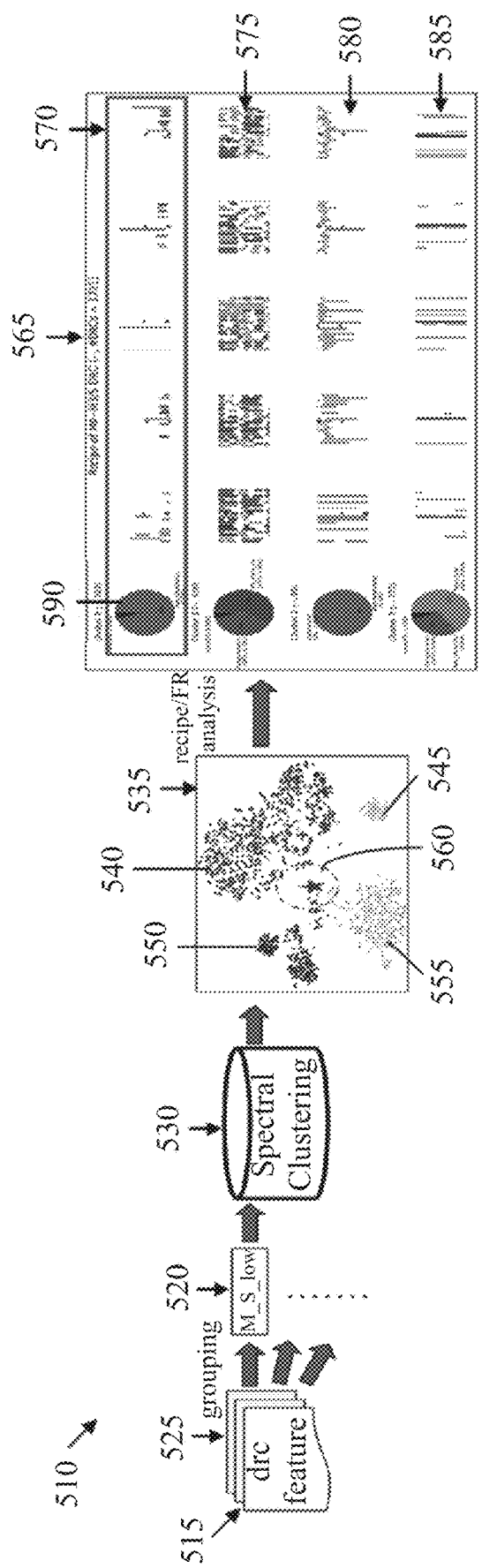
FIG. 7 is another example block diagram of the DRC verification system of FIG. 2 showing recipe selection for fixing the DRC violation in the layout clip of FIG. 3, in accordance with some embodiments.

Referring to FIG. 7, an example block diagram 510 shows outlier detection and recipe selection, in accordance with some embodiments of the present disclosure. As discussed above, in some embodiments, a plurality of layout clips 515 may be analyzed for DRC violations and correction. Each of the plurality of layout clips 515 may be classified using the classification 230. For example, FIG. 7 shows a classification 520 of a layout clip 525 of the plurality of layout clips 515. The layout clip 525 may be considered analogous to the layout clip 160. Specifically, the classification 520 indicates that the layout clip 525 has a DRC violation in the metal interconnect 240, and specifically, a spacing violation of the violation types 250 in one of the M0-M3 layers (e.g., the "low layer" of the layers 260). The remaining ones of the plurality of layout clips 515 may be similarly classified.

Based upon the classification, each of the plurality of layout clips 515 may then undergo spectral clustering 530 to identify a group (e.g., the group 280) having one or more clusters (e.g., the clusters 290-305). Spectral clustering or cluster analysis may involve grouping layout patterns (e.g., layout clips) such that layout patterns having DRC violations that are more similar to each other than to DRC violations of other layout patterns may be grouped together in the same cluster. In some embodiments, the spectral clustering 530 may be performed by a spectral clustering algorithm. In some embodiments, the spectral clustering algorithm may be implemented by a machine learning/artificial intelligence algorithm such as those mentioned above. In other embodiments, the spectral clustering 530 may be performed using other techniques. Likewise, in some embodiments, other techniques for identifying similar layout patterns as each of the plurality of layout clips 515 and grouping those similar layout patterns in clusters may be used.

In some embodiments, an output of the spectral clustering 530 may be shown in a visual format, such as graph 535. The graph 535 may show various groupings 540-555 of various layout patterns that may be clustered together. For example, in some embodiments, the grouping 540 may include a plurality of layout patterns that have similar DRC violations, and therefore, clustered together in a single cluster. Similarly, the groupings 545-555 may include clusters of similar layout patterns. The number of groupings in the graph 535 may vary. Further, the number of layout patterns in each grouping may vary. The graph 535 may also show where a particular layout clip may lie amongst the groupings 540-555. For example, the graph 535 may show a location 560 of the layout clip 525. From the location 560, it may be determined that the layout clip 525 is more similar to the groupings 550 and 555 than the grouping 545. Based on the graph 535, a group having one or more clusters may be identified for the layout clip 525. For example, a group 565 for the layout clip 525 may include one or more clusters 570-585 (e.g., the clusters 290-305) that may have been selected from either or both the groupings 550, 555. In some embodiments, the clusters 570-585 may be selected to include layout patterns that have similar DRC violations as the DRC violation in the layout pattern of the layout clip 525. Further, the layout patterns in the clusters 570-585 may include those layout patterns (e.g., layout clips having DRC violations) that the DRC verification system 155 has previously analyzed. As indicated above, in some embodiments, the clustering (e.g., the spectral clustering 530, identifying the groupings 540-560, forming the group 565 having the clusters 570-585) may be performed by a machine learning/artificial learning algorithm, such as those discussed above.

Further, based upon clusters 570-585, the DRC verification system 155 may determine (e.g., via an anomaly detection algorithm) whether the layout pattern of the layout clip 525 is an outlier or inlier. For example, the DRC verification system 155 may determine that the DRC violation in the layout pattern of the layout clip 525 is similar to the DRC violations of the other layout patterns in the cluster 570. Therefore, the DRC verification system 155 may determine that the layout clip 525 belongs to the cluster 570.

In addition to determining that the layout clip 525 is an inlier and belongs to the cluster 570, the DRC verification system 155 may perform recipe and fix rate analyses. By performing recipe and fix rate analyses, the DRC verification system 155 may create a recipe fix rate graph for each of the clusters 570-285. For example, the DRC verification system 155 may create a recipe fix rate graph 590 for the cluster 570. The recipe fix rate graph 590 is similar to the recipe fix rate graph 330 and may identify the fix rates of various recipes used to correct DRC violations in layout patterns of the cluster 570. Although not shown, in some embodiments, the DRC verification system 155 may also generate a pattern violation graph (e.g., similar to the pattern violation graph 325) to show the various DRC violations in the layout patterns of a particular cluster. In some embodiments, based upon the recipe fix rate graph 590, the DRC verification system 155 may pick a recipe to apply to the layout clip 525 to correct one or more DRC violations in that layout clip.

The remaining ones of the plurality of layout clips 515 may be similarly analyzed as the layout clip 525.

Figure 8:
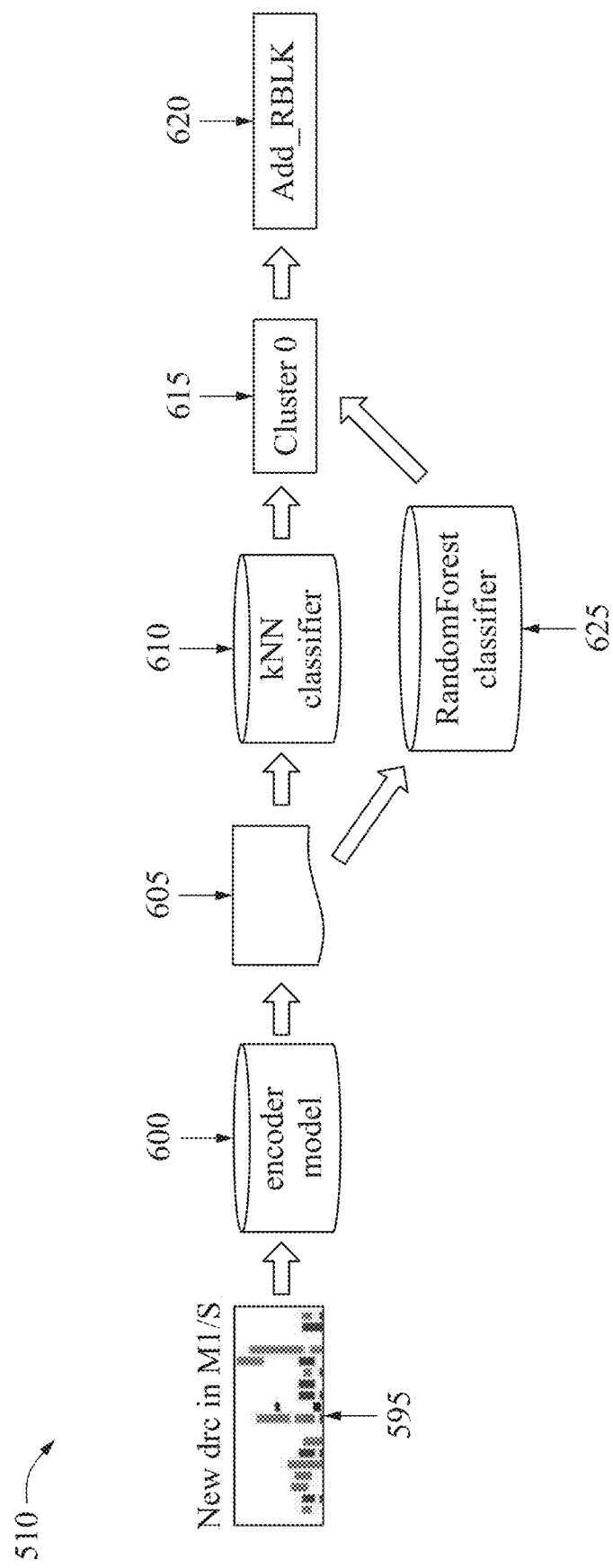
FIG. 8 is another example block diagram showing additional details of the DRC verification system of FIG. 7, in accordance with some embodiments.

Turning now to FIG. 8, another block diagram showing outlier detection and recipe analysis of a layout clip 595 is shown, in accordance with some embodiments of the present disclosure. The layout clip 595 may be considered analogous to the layout clips 160 and 525. The block diagram of FIG. 8 may be implemented by the DRC verification system 155. The layout clip 595 may be input into an encoder model 600. The encoder model 600 may be used to extract certain information (e.g., pattern layout information) from the layout clip 595 and propagate the extracted information as output 605. Any suitable encoder model may be used. The output 605 may then be input into the machine learning algorithm that is desired to be used for performing the spectral clustering 530 and/or producing the group 565 having the clusters 570-585, as well as the recipe fix rate graph 590. In some embodiments, the machine learning algorithm may also be used to select a suitable recipe for applying to the layout clip 595.

For example, in some embodiments, a KNN classifier 610 may be used to perform the spectral clustering 530. Thus, the KNN classifier may receive the output 605 to generate a group (e.g., the group 565) having one or more clusters (e.g., the clusters 570-585), as well as a recipe fix rate graph (e.g., the recipe fix rate graph 590) for each of those clusters. From the various clusters, the KNN classifier 610 may output a cluster 615 to which the layout clip 595 is determined to belong. If the KNN classifier 610 determines that the layout clip 595 does not belong to any cluster, the KNN classifier may output an indication that the layout clip is an outlier, in which case the layout clip may be passed on for manual review.

On the other hand, if the KNN classifier 610 determines that the layout clip 595 belongs to the cluster 615 and is an inlier, the KNN classifier may also select a recipe 620 from a pool of recipes (e.g., the recipes in the recipe fix rate graph generated for the cluster 615) to fix the DRC violation(s) in the layout clip. In some embodiments, the KNN classifier 610 may also apply the recipe 620 to the layout clip 595 to fix the DRC violation(s). The pool of recipes may include previously applied recipes to fix DRC violations in the other layout patterns in the cluster 615.

In some embodiments, instead of using the KNN classifier 610, in some embodiments, a random forest classifier 625 may be used for performing the spectral clustering 530, the recipe prediction (e.g., selecting the recipe 620), and/or applying the recipe to the layout clip 595. In some embodiments, the KNN classifier 610 may be used to perform some of the operations, while the random forest classifier 625 may be used to perform the other operations. The operations may include performing the spectral clustering 530, the recipe prediction, applying the recipe. In other embodiments, machine learning algorithms other than, or in addition to, the KNN classifier 610 and the random forest classifier 625 may be used. For example, in some embodiments, an isolation forest classifier may be used. In some embodiments, an isolation forest classifier may be used for performing outlier detection and the KNN classifier 610 and/or the random forest classifier 625 may be used for selecting a suitable recipe.

Further, it to be understood that only some elements of the block diagram of FIG. 8 are shown herein. Nevertheless, FIG. 8 is intended to include other or additional elements that are needed or considered desirable to have in performing the spectral clustering 530, the recipe prediction (e.g., selecting the recipe 620), and applying the selected recipe to the layout clip 595. Some additional details of the block diagram are shown in the block diagram of FIG. 10.

Figure 9:
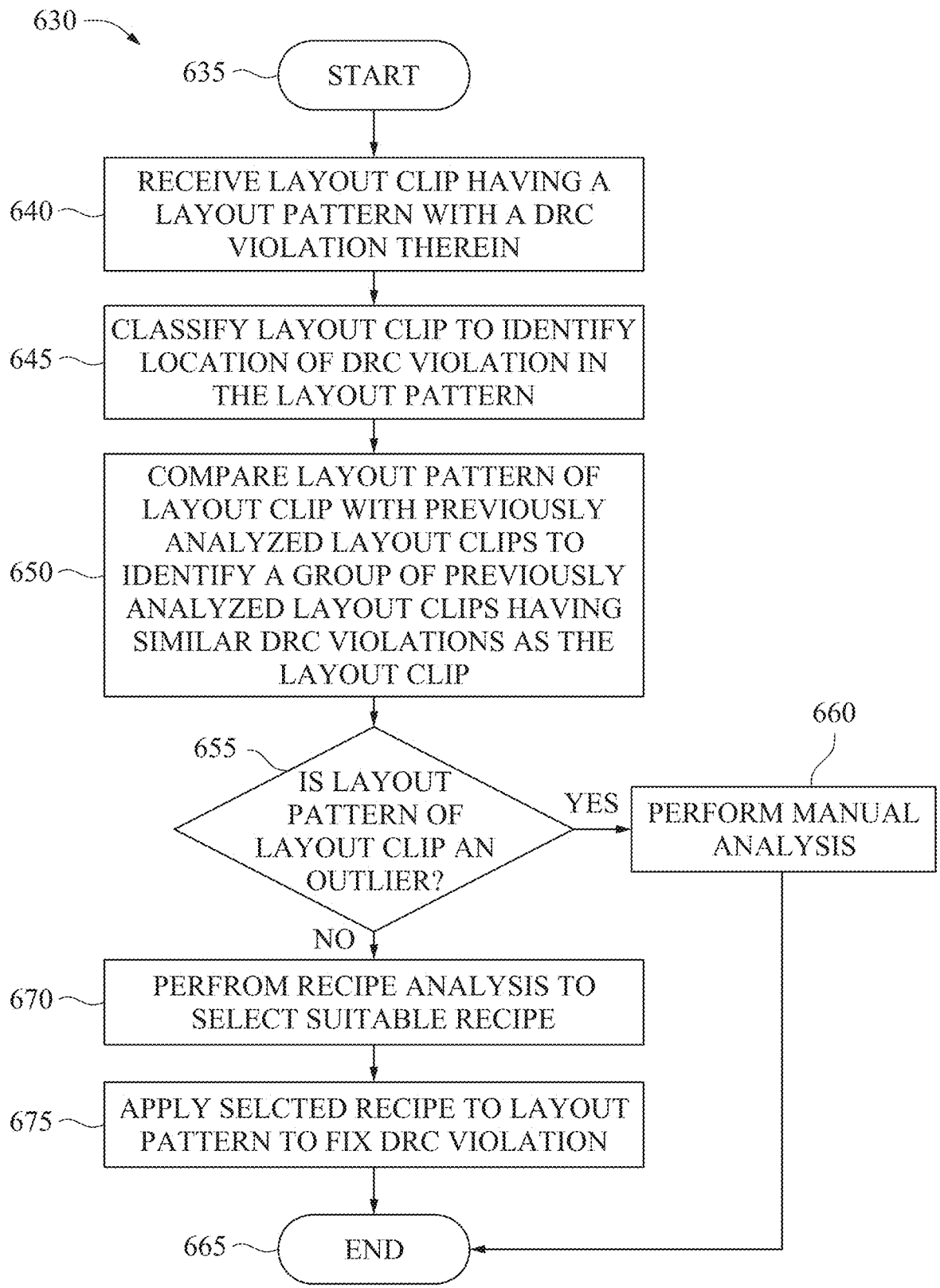
FIG. 9 is an example flowchart outlining operations for performing an outlier detection and recipe selection for fixing the DRC violation in the layout clip of FIG. 3, in accordance with some embodiments.

Turning to FIG. 9, an example flowchart outlining a process 630 is shown, in accordance with some embodiments of the present disclosure. The process 630 may be used for analyzing a layout pattern of a layout clip. Analyzing the layout pattern of the layout clip may include classifying the layout clip, determining whether the layout pattern in the layout clip is an outlier or an inlier, and selecting a suitable recipe for fixing the DRC violation(s) in the layout pattern of the layout clip upon determining that the layout pattern is an inlier.

The process 630 may be implemented by the DRC verification system 155 (e.g., the design rule check application 135). Thus, upon starting at operation 635, the DRC verification system 155 receives a layout clip (e.g., the layout clip 525) having a layout pattern with a DRC violation therein at operation 640. The DRC verification system 155 classifies the layout clip at operation 645. In some embodiments, the DRC verification system 155 classifies the layout clip (e.g., the layout clip 525) using the classification 230 to identify the location of the DRC violations in the layout pattern of the layout clip (e.g., the layout clip 525). As discussed above, in some embodiments, the layout clip may have a single DRC violation. In other embodiments, the layout clip may have a plurality of DRC violations. In some embodiments, the classification 230 may be performed for each DRC violation in the layout pattern of the layout clip. Thus, if the layout clip (e.g., the layout clip 525) includes a layout pattern with a plurality of DRC violations, the classification 230 may be performed for each DRC violation such that the layout clip may have a plurality of classifications.

At operation 650, the DRC verification system 155 compares the layout clip (e.g., the layout clip 525) with other previously analyzed layout clips to identify a group of previously analyzed layout clips that have similar DRC violations as the DRC violation in the layout clip. In some embodiments, the comparison may be performed by performing the spectral clustering (e.g., the spectral clustering 530) based on the classification of a DRC violation of the layout clip (e.g., the layout clip 525), as discussed above. By performing the spectral clustering, the DRC verification system 155 may analyze previously analyzed layout patterns to identify those layout patterns having the same DRC violations as that in the layout clip.

In some embodiments, the identified layout patterns from the previously analyzed layout clips may have the same classification as the layout clip. In some embodiments, the DRC verification system 155 may also include the pattern layouts of somewhat related classifications in performing the spectral clustering. For example, in some embodiments, if the violation type of the layout clip (e.g., the layout clip 525) is a spacing (S) violation type, the DRC verification system 155 may also consider layout patterns having the violation type, color spacing (CS), in performing the spectral clustering. Thus, in some embodiments, the DRC verification system 155 may consider only the classification of the layout clip, while in other embodiments, the DRC verification system may also consider related classifications in performing the spectral clustering.

The DRC verification system 155 may also form groupings of those previously analyzed layout patterns to obtain a spectral graph (e.g., the graph 535). The DRC verification system 155 may also form a group (e.g., the group 565) having one or more clusters (e.g., the clusters 570) based on the spectral clustering. In some embodiments, the DRC verification system 155 may implement a KNN classifier (e.g., the KNN classifier 610), a random forest classifier (e.g., the random forest classifier 625), and/or other mechanisms to perform the spectral clustering. Thus, the DRC verification system 155 uses historical data (e.g., past layout patterns) to analyze current data (e.g., a current layout clip) and predict an appropriate course of action (e.g., recipe selection) for fixing DRC violations in the current data.

By using the spectral graph, the DRC verification system 155 determines whether the layout clip (e.g., the layout clip 525) is an outlier or inlier at operation 655. In some embodiments, the DRC verification system 155 may perform data augmentation (e.g., change the orientation) of the layout clip before determining whether the layout clip is an outlier or inlier. In some embodiments, the DRC verification system 155 may determine whether the layout clip is outlier or inlier by comparing the layout clip with other layout patterns using the spectral graph and group/clusters formed at the operation 650. In some embodiments, the DRC verification system 155 may use the KNN classifier (e.g., the KNN classifier 610), the random forest classifier (e.g., the random forest classifier 625), and/or other mechanisms to determine whether the layout clip (e.g., the layout clip 525) is an outlier or inlier.

If, at the operation 655, the DRC verification system 155 determines that the layout clip (e.g., the layout clip 525) is an outlier, the process 630 proceeds to operation 660 where the layout clip is flagged for manual review. A designer may then review the layout clip, determine a suitable recipe, and apply the selected recipe to fix the DRC violations in that layout clip. Upon flagging the layout clip for manual review at the operation 660, the process 630 ends at operation 665.

On the other hand, if at the operation 655, the DRC verification system 155 determines that the layout clip (e.g., the layout clip 525) is an inlier, the process 630 proceeds to operation 670. At the operation 670, the DRC verification system 155 selects a suitable recipe from a pool of recipes to correct the DRC violations in the layout clip. In some embodiments, in addition to creating the spectral graph at the operation 650, the DRC verification system 155 may also create a recipe fix rate graph (e.g., the recipe fix rate graph 590) for the layout clip (e.g., the layout clip 525) to identify the fix rates of the recipes applied to the various layout patterns in the cluster (e.g., the cluster 570) to which the layout clip belongs. In some embodiments, the recipes applied to the cluster (e.g., the cluster 570) and that are included in the recipe fix rate graph may form a pool of recipes from which the DRC verification system 155 may select a suitable recipe from. In some embodiments, the DRC verification system 155 may select the recipe from this pool of recipes that has the highest fix rate (e.g., the recipe with the largest portion in the pie chart representation of the recipe fix rate graph). By determining the fix rate and selecting the recipe corresponding to the highest fix rate, the DRC verification system 155 may avoid inconsistencies in recipe selection. For example, if a first recipe and a second recipe were both previously used for correcting a particular DRC violation in a cluster, and if the first recipe has a higher fix rate than the second recipe, the DRC verification system may select the first recipe instead of the second recipe, thereby ensuring a higher success rate of fixing DRC violations while resolving recipe inconsistency. Thus, in some embodiments, the DRC verification system 155 may "rank" the recipes based on fix rate.

In other embodiments, the DRC verification system 155 may "rank" pattern violations instead of fix rates. In some embodiments, the DRC verification system 155 may also generate a pattern violation graph (e.g., the pattern violation graph 325) for the layout clip (e.g., the layout clip 525) at the operation 650. The pattern violation graph may identify the types of DRC violations (also referred to herein as pattern violations) in the cluster (e.g., the cluster 570) to which the layout clip belongs. The DRC verification system 155 may then rank the various identified pattern violations from the pattern violation graph. In some embodiments, the DRC verification system 155 may use a formula to rank the pattern violations. Example ranking of pattern violation errors is discussed in FIG. 11 10 below. Based upon the ranking, in some embodiments, the DRC verification system 155 may select the recipe corresponding to the highest ranked pattern violation.

In some embodiments, the DRC verification system 155 may be configured to select the recipe corresponding to the largest number of pattern violation errors from the pattern violation graph (e.g., when the pattern violation graph is represented as a pie chart, select the pattern violation having the largest portion in the pie chart). In some embodiments, the DRC verification system 155 may rank the recipes in the recipe fix rate graph to select the highest ranked recipe. In other embodiments, the DRC verification system 155 may use other or additional criteria to select a suitable recipe for the layout clip (e.g., the layout clip 525). In some embodiments, the recipe selection may be performed by the KNN classifier (e.g., the KNN classifier 610), the random forest classifier (e.g., the random forest classifier 625), and/or other mechanisms.

Upon selecting a suitable recipe at the operation 670, the DRC verification system 155 applies the selected recipe to the layout clip (e.g., the layout clip 525) at operation 675. In some embodiments, the DRC verification system 155 may apply the recipe using KNN classifier (e.g., the KNN classifier 610), the random forest classifier (e.g., the random forest classifier 625), and/or other mechanisms. In some embodiments, the DRC verification system 155 may identify the suitable recipe at the operation 670 and a designer may apply the recipe to the layout clip. Upon applying the recipe to the layout clip, the process 630 ends at the operation 665.

Figure 10:
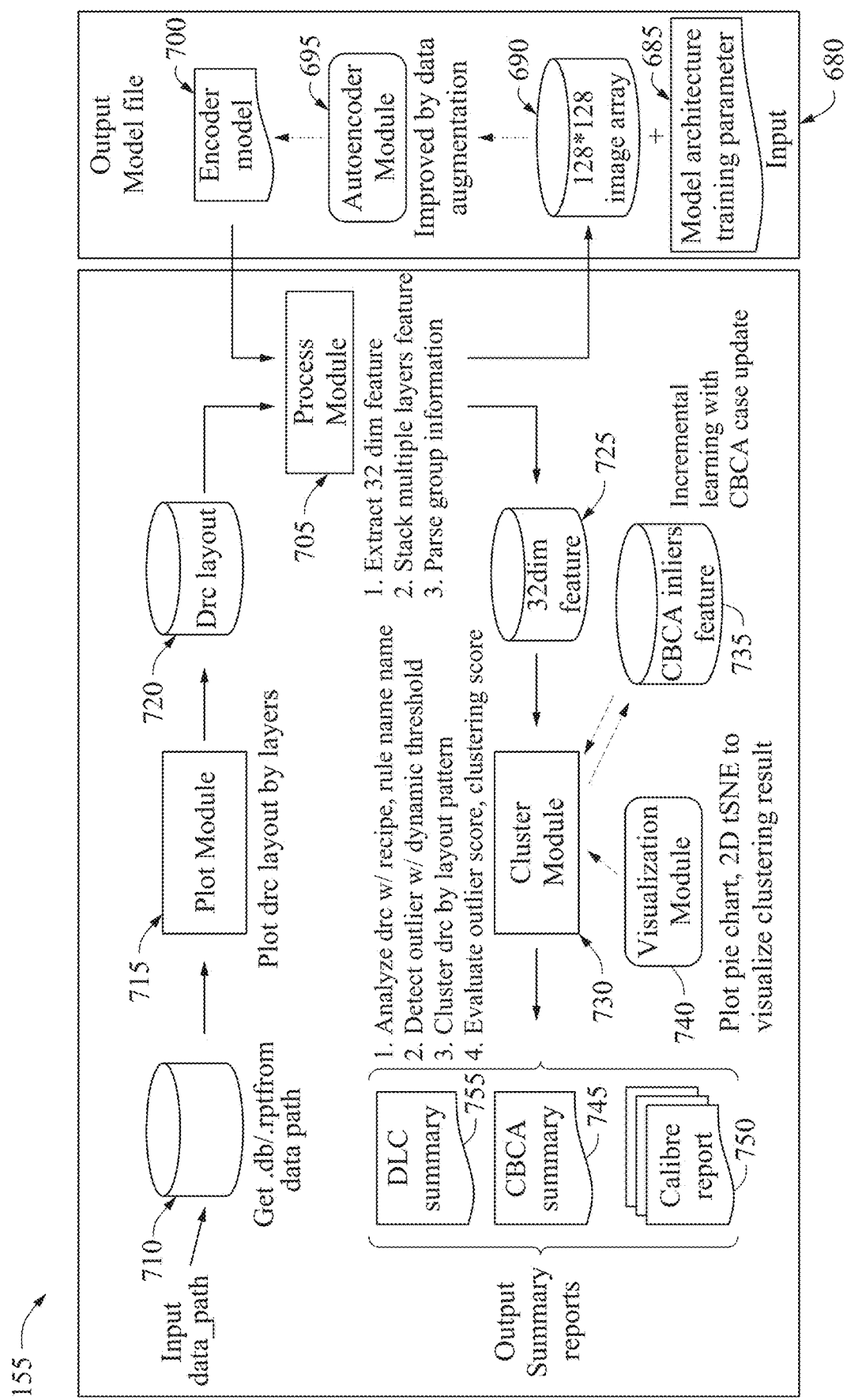
FIG. 10 is yet another example block diagram of the DRC verification system of FIG. 2, in accordance with some embodiments.

Turning to FIG. 10, an example block diagram showing additional details of the DRC verification system 155 are shown, in accordance with some embodiments of the present disclosure. The DRC verification system 155 may include a training block 680 for continuously refining or training the machine learning/artificial intelligence algorithm. The training block 680 may include a model architecture block 685 that may store training models, schedules, and other information needed by the machine learning/artificial intelligence algorithm being used by the DRC verification system 155 to perform the outlier detection 165, the DRC layout similarity grouping 170, as well as select a suitable recipe, as discussed above. Further, each layout pattern may be considered an image represented by an array of pixels. For example, in some embodiments, a layout pattern may be represented by an array of 128×128 pixels. In other embodiments, layout patterns may be represented by pixel arrays of different sizes. In some embodiments, an image array 690 may be configured to store layout patterns. In some embodiments, each layout pattern may be considered an input feature map.

In some embodiments, the training block 680 may also include an auto-encoder 695. The auto-encoder 695 may be configured to reduce (e.g., ignore) signal "noise," by performing dimensionality reduction. For example, in some embodiments, the auto-encoder 695 may receive a 128×128 input feature map and reduce that input feature map to a 32×32 input feature map. The auto-encoder 695 may then output the reduced dimensionality input feature map to an encoder model 700. The encoder model 700 may be analogous to the encoder model 600. The encoder model 700 may be configured to extract certain information (e.g., pattern layout information) from the input feature map received from the auto-encoder 695. An output of the encoder model 700 may be input into a process module 705. In some embodiments, the output from the encoder model 700 may be related to historical data or previously analyzed layout patterns and previously used recipes.

In some embodiments, the historical data (e.g., the previously analyzed layout patterns and previously used recipes) may be retrieved at block 710 and the historical data may be converted into DRC layout by layers at block 715. An output 720 of the plot of DRC layout by layers may be input into the process module 705. In some embodiments, the process module 705 may also receive the layout clip currently being analyzed. The process module 705 may, in some embodiments, perform dimensionality reduction (e.g., similar to the auto-encoder 695), stack multiple layer features, as well as parse group information. Output 725 from the process module 705 may be stored into the image array 690 for continuously training and refining the training model, as well as input into a cluster module 730.

The cluster module 730 may analyze the layout clip as discussed above. Specifically, the cluster module 730 may perform the classification 230 of the layout pattern in the layout clip being analyzed, perform the spectral clustering 530, create one or more clusters (e.g., the clusters 570-585), perform outlier detection, as well as select a suitable recipe. In some embodiments, the cluster module 730 may use CBCA inlier features 735 for training circuits for improving training model (e.g., the classifier being used by the DRC verification system 155) generalizations. The cluster module 730 may generate the spectral graph 535, the pattern violation graph 325, and the recipe fix rate graph 330, and output these visual aids to a visualization module 740 for presenting to a user via the output devices 120. The cluster module 730 may also generate one or more reports. For example, the cluster module 730 may generate a report 745 indicative of one or more parameters for improving the training model generalizations, a calibre report 750 indicative of parameters associated with the physical verification platform, and a DRC summary 755. An example of the DRC summary is discussed in FIG. 11 below.

Referring now to FIG. 11, an example of the DRC summary 755 is shown, in accordance with some embodiments of the present disclosure. The DRC summary 755 may be generated for one or more layout clips (e.g., the layout clip 160) being analyzed. The DRC summary 755 may include pattern violation name or rule name (not shown in the DRC summary, but see example 760, "PV rule name") identifying the DRC violations types in the layout clip(s) that were analyzed, a total number of DRC violations of each DRC violation type (N_t) (e.g., "#DRC" in the example 760), a total fix rate of the associated DRC violation type (FR) (e.g., "total FR" in the example 760), an outlier percentage of the associated DRC violation type (p_o) (e.g., "% outliers" in the example 760), fix rate of the outliers (FR_o) (e.g., "outlier FR" in the example 760), an inlier percentage of the associated DRC violation type (p_i) (e.g., "% inliers" in the example 760), fix rate of the inliers (FR_i) (e.g., "inlier FR" in the example 760), suggested recipe (e.g., "prev most used recipe" in the example 760), and a rank (e.g., "rank" in the example 760) that may be computed based on the following formula:

$$Log(N\_t)*((1-FR\_o)*p\_o+0.85*((1-FR\_i)*p\_i))$$

In some embodiments, the DRC summary 755 may include other or additional parameters. In some embodiments, based upon the rank of the associated DRC violation type, the suggested recipe may be selected.

Thus, the present disclosure provides a mechanism to predict DRC recipe by designed layout features with about 90% accuracy and with about 85% less effort. The present disclosure also enables new capability to analyze a large number (e.g., analyzing about 4000 in about 3 seconds) layout patterns for identifying outliers and recipe inconsistencies, while enabling stratification clustering to explore recipe distribution and correlating with cluster fix rate (e.g., analyzing about 4000 layout patterns in about 1 minute).

In accordance with some aspects of the present disclosure, a method is disclosed. The method includes receiving, by a processor executing computer-readable instructions stored on a memory, a layout pattern having a design rule check (DRC) violation therein, determining, by the processor, that the layout pattern is an inlier based upon a comparison of the layout pattern with a plurality of previously analyzed layout patterns, such that the comparison is performed by an anomaly detection algorithm, and selecting, by the processor, a recipe from a pool of recipes previously applied to the plurality of previously analyzed layout patterns for fixing the DRC violation in the layout clip upon determining that the layout pattern is an inlier.

In accordance with some other aspects of the present disclosure, a system is disclosed. The system includes a memory having computer-readable instructions stored thereon and a processor that executes the computer-readable instructions to classify a layout pattern having a design rule check (DRC) violation therein to determine a classification of the DRC violation to identify a group of previously analyzed layout patterns having DRC violations that are similar to the DRC violation in the layout pattern and select a suitable recipe from a pool of recipes applied to the group of previously analyzed layout patterns for fixing the DRC violation in the layout pattern.

In accordance with yet other aspects of the present disclosure, a non-transitory computer-readable media having computer-readable instructions stored thereon is disclosed. The computer-readable instructions when executed by a processor cause the processor to classify a layout pattern having a design rule check (DRC) violation therein to determine a classification of the DRC violation by determining a pattern type of a DRC violation, determining, based upon the pattern type, a violation type of the DRC violation, and determining, based upon the violation type, a layer at which the DRC violation occurs. The computer-readable instructions when executed by a processor also causes the processor to identify a group of previously analyzed layout patterns having DRC violations that are similar to the DRC violation in the layout pattern based upon the classification and select a recipe from a pool of recipes previously applied to the group of previously analyzed layout patterns for fixing the DRC violation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 receiving, by a processor executing computer-readable instructions stored on a memory, a layout pattern having a design rule check (DRC) violation therein;
 determining, by the processor, whether the layout pattern is an outlier or an inlier based upon a comparison of the layout pattern with a plurality of previously analyzed layout patterns, wherein the comparison is performed by an anomaly detection algorithm;
 selecting, by the processor, a recipe from a pool of recipes previously applied to the plurality of previously analyzed layout patterns for fixing the DRC violation in the layout pattern upon determining that the layout pattern is the inlier; and
 manufacturing a semiconductor device based on the layout pattern and the selected recipe.

2. The method of claim 1, further comprising classifying, by the processor, the DRC violation in the layout pattern based upon a pattern type, a violation type, and a layer having the DRC violation.

3. The method of claim 2, wherein the pattern type determines whether the DRC violation is in a metal interconnect or a via structure.

4. The method of claim 2, wherein the violation type comprises at least one of spacing, area, length, recommended, width, overlap, enclose, color spacing, extension, or double pattern rule violation types.

5. The method of claim 2, wherein the layer having the DRC violation comprises one of a first group of metal interconnect layers, a second group of metal interconnect layers, or a third group of metal interconnect layers.

6. The method of claim 2, wherein classifying the layout pattern comprises:
 determining, by the processor, the pattern type of the DRC violation;
 determining, by the processor, based upon the pattern type, the violation type of the DRC violation; and
 determining, by the processor, based upon the violation type, the layer having the DRC violation.

7. The method of claim 2, further comprising identifying, by the processor, based upon the classification, a subset of previously analyzed layout patterns from the plurality of previously analyzed layout patterns having DRC violations that are similar to the DRC violation in the layout pattern for selecting the recipe.

8. The method of claim 7, wherein selecting the recipe from the pool of recipes comprises determining the recipe having a highest fix rate amongst the pool of recipes, wherein the pool of recipes comprises previously applied recipes to the subset of previously analyzed layout patterns.

9. The method of claim 7, wherein selecting the recipe from the pool of recipes comprises ranking pattern violations in the subset of previously analyzed layout patterns, and selecting the recipe previously applied to a highest ranked pattern violation.

10. The method of claim 1, wherein the selecting the recipe is performed by at least one of a k-nearest neighbor classifier or a random forest classifier.

11. The method of claim 1, wherein the anomaly detection algorithm comprises an isolation forest classifier.

12. The method of claim 11, further comprising changing an orientation of the layout pattern for determining that the layout pattern is the inlier.

13. A system comprising:
 a memory having computer-readable instructions stored thereon; and
 a processor that executes the computer-readable instructions to:
  receive a layout pattern having a design rule check (DRC) violation therein;
  classify the layout pattern to determine as whether the layout pattern is an outlier or an inlier based upon a comparison of the layout pattern with a plurality of previously analyzed layout patterns, wherein the comparison is performed by an anomaly detection algorithm;
  select a suitable recipe from a pool of recipes applied to the plurality of previously analyzed layout patterns for fixing the DRC violation in the layout pattern upon determining that the layout pattern is the inlier; and
  manufacture a semiconductor device based on the layout pattern and the selected recipe.

14. The system of claim 13, wherein to classify the layout pattern, the processor further executes the computer-readable instructions to:
 determine a pattern type of the DRC violation in the layout pattern;
 determine, based upon the pattern type, a violation type of the DRC violation; and
 determine, based upon the violation type, a layer at which the DRC violation occurs in the layout pattern.

15. The system of claim 13, wherein to select the suitable recipe from the pool of recipes, the processor further executes the computer-readable instructions to generate at least one of a pattern violation graph or a recipe fix rate graph, wherein the pattern violation graph identifies pattern violations identified in the plurality of previously analyzed layout patterns, and wherein the recipe fix rate graph identifies a fix rate of each recipe in the pool of recipes.

16. The system of claim 15, wherein the processor further executes the computer-readable instructions to select the recipe having a highest fix rate in the recipe fix rate graph as the suitable recipe.

17. The system of claim 15, wherein the processor further executes the computer-readable instructions to:
 rank the pattern violations in the pattern violation graph; and
 select the recipe previously applied to a highest ranked pattern violation as the suitable recipe.

18. A non-transitory computer-readable media comprising computer-readable instructions stored thereon, that when executed by a processor cause the processor to:
 receive a layout pattern having a design rule check (DRC) violation therein;
 classify the layout pattern to determine whether the layout pattern is an outlier or an inlier based upon a comparison of the layout pattern with a plurality of previously analyzed layout patterns, wherein the comparison is performed by an anomaly detection algorithm;

select a recipe from a pool of recipes previously applied to the group of previously analyzed layout patterns upon determining that the layout pattern is the inlier; and manufacture a semiconductor device based on the layout pattern and the selected recipe.

19. The non-transitory computer-readable media of claim 18, wherein the computer-readable instructions to classify the layout pattern comprises instructions to cause the processor to:

determine of a pattern type of the DRC violation;

determine, based upon the pattern type, of a violation type of the DRC violation; and determine, based upon the violation type, of a layer at which the DRC violation occurs.

* * * * *